United States Patent
Asano et al.

(10) Patent No.: US 7,429,817 B2
(45) Date of Patent: Sep. 30, 2008

(54) MULTILAYER PIEZOELECTRIC ELEMENT

(75) Inventors: Hiroaki Asano, Kuwana (JP); Yoichi Kobane, Kuwana (JP)

(73) Assignee: Denso Corporation (JP)

(*) Notice: Subject to any disclaimer, the term of this patent is extended or adjusted under 35 U.S.C. 154(b) by 0 days.

(21) Appl. No.: 11/822,014

(22) Filed: Jun. 29, 2007

(65) Prior Publication Data

US 2008/0001503 A1 Jan. 3, 2008

(30) Foreign Application Priority Data

Jun. 30, 2006 (JP) .............................. 2006-181593

(51) Int. Cl.
*H01L 41/047* (2006.01)

(52) U.S. Cl. .................... 310/364; 310/365; 310/366; 310/328

(58) Field of Classification Search ................ 310/328, 310/363–366
See application file for complete search history.

(56) References Cited

U.S. PATENT DOCUMENTS 6,522,052 B2 * 2/2003 Kihara et al. ............... 310/366

2001/0033125 A1 10/2001 Takao et al.
2002/0043901 A1 * 4/2002 Kihara et al. .............. 310/366
2002/0089266 A1 * 7/2002 Bindig et al. .............. 310/364
2004/0164638 A1 * 8/2004 Asaba ........................ 310/208
2006/0232172 A1 * 10/2006 Asano et al. ............... 310/366
2008/0007144 A1 * 1/2008 Takei et al. ................ 310/364

FOREIGN PATENT DOCUMENTS

| DE | 19945933 | 5/2001 |
| JP | 08-242025 | 9/1996 |
| JP | 2002-009356 | 1/2002 |

* cited by examiner

*Primary Examiner*—J. A San Martin
(74) *Attorney, Agent, or Firm*—Nixon & Vanderhye PC

(57) ABSTRACT

A multilayer piezoelectric element has a pair of outer electrodes and a multilayer ceramic body composed of piezoelectric layers and inner electrode layers which are alternately stacked. The outer electrodes are formed on a pair of electrode connecting surfaces in the outer circumference surfaces of the multilayer ceramic body. Each outer electrode electrically connected to the inner electrode layers through connecting material is composed of a fixed part, a free part having plural expandable-openings, and a rigid part. The fixed part is electrically contacted with the connection material. A sectional area of the rigid part is rather than that of each of the fixed part and the free part in a width direction of the outer electrode. Each outer electrode has at least one part where the fixed part, the free part and the rigid part are arranged in order in the width direction.

16 Claims, 13 Drawing Sheets

MULTILAYER PIEZOELECTRIC ELEMENT

CROSS-REFERENCE TO RELATED APPLICATION

This application is related to and claims priority from Japanese Patent Application No. 2006-181593 filed on Jun. 30, 2006, the contents of which are hereby incorporated by reference.

BACKGROUND OF THE INVENTION

1. Field of the Invention

The present invention relates to a multilayer piezoelectric element to be applied to various applications such as a fuel injection valve for vehicles, precision positioning devices for use in optical apparatus, a driving element for preventing vibration, and a piezoelectric actuator for use in inkjet printers.

2. Description of the Related Art

There is a multilayer piezoelectric element, for use in a piezoelectric actuator and the like, having a pair of outer electrodes formed on surfaces of a multilayer ceramic body composed of piezoelectric layers made of piezoelectric materials and inner electrodes of an electrical conductivity which are alternately laminated or stacked. Applying a specified voltage to the inner electrodes in the multilayer piezoelectric element causes the displacement of each piezoelectric layer, and the multilayer piezoelectric element generates and outputs a driving power.

In recent use, a small sized piezoelectric actuator is applied by a higher electric field under a high pressure environment for a long period of time so as to obtain a large amount of displacement in the actuator. When such a piezoelectric actuator made of a multilayer piezoelectric element is used under a high electric field and a high pressure for a long period of time, it causes a separation of the outer electrodes from the multilayer piezoelectric element or cracks therein, and those phenomena cause breaking of the outer electrodes. The occurrence of those cracks or breaking in a part of the outer electrodes halts a voltage supply and the displacement characteristic of the multilayer piezoelectric element varies during its working. In order to avoid the variation of the displacement characteristic, there are related art techniques which have proposed many types of multilayer piezoelectric actuators. For example, Japanese patent laid open publication JP 2002-9356 has proposed a multilayer piezoelectric actuator element having conductive materials which are separated in position from a multilayer body through outer electrodes. This configuration can suppress the deterioration of the performance of the multilayer piezoelectric actuator element even if cracks occur in the multilayer body or the outer electrodes.

Japanese patent laid open publication JP H8-242025 as another related-art technique has proposed a piezoelectric actuator in which piezoelectric element connecting electrodes of a thin plate shape having notches formed in a wide direction thereof are contacted on side surfaces of a piezoelectric element body with a conductive adhesive agent in order to electrically contact those connecting electrodes with inner electrodes of the piezoelectric actuator.

German patent No. DE 19945933 as another related-art technique has disclosed a piezoelectric actuator in which electric layers are connected to contact pins through contact wires, respectively, in order to keep the conductivity of an entire multilayer body of the piezoelectric actuator.

However, the related-art techniques described above have following drawbacks. Because the primary related-art technique JP 2002-9356 has not adequately keep the electrical conductivity of the entire of the conductive materials and has a small current capacity, it is impossible to apply it to the high-speed actuator technical field such as an injector for vehicles.

Although the secondary related-art technique JP H8-242025 has the effect to reduce a stress applied to the notches formed in the piezoelectric element connecting electrodes of a thin plate shape, cracks are generated in the areas other than the notch formation area where the notches are fixed by the conductive adhesive agent, and those areas cannot adequately reduce the stress applied. The presence of the cracks cannot adequately keep the electrical conductivity between the piezoelectric element connecting electrodes and the inner electrodes, and will vary the displacement characteristic of the piezoelectric element during on its driving.

Still further, the related-art technique DE 19945933 as another related-art technique cannot connect wires to all of the electrical layers in its manufacturing, and thereby cannot adequately keep its durability for a long period of time.

Accordingly, there is a strong demand of providing a multilayer piezoelectric element which is capable of suppressing the occurrence of cracks and breaking therein and of keeping its performance such as a displacement characteristic even if it will be used for a long period of time under various strict environments.

SUMMARY OF THE INVENTION

It is an object of the present invention to provide a multilayer piezoelectric element having a pair of outer electrodes capable of increasing its performance and of enhancing its durability for a long period of time.

To achieve the above purpose, the present invention provides a multilayer piezoelectric element having a multilayer ceramic body and a pair of outer electrodes. The multilayer ceramic body has a stacked structure (or a lamination structure) in which piezoelectric layers made of piezoelectric material and a plurality of inner electrode layers of an electrical conductivity are alternately stacked (or laminated). A pair of the outer electrodes is placed on a pair of electrode connecting surfaces in outer circumference surfaces of the multilayer ceramic body so that the outer electrode layers are electrically connected alternately to a plurality of the inner electrode layers. Each outer electrode has a fixed part, a free part, and a rigid part. The fixed part is electrically contacted with the corresponding electrode connecting surface through connecting material of electrical conductivity having a smaller width than a width of the outer electrode. The free part has a plurality of openings (or fine-sized holes, or porous). The free part does not contact with the connecting material and is expandable in the stacked direction of the multilayer ceramic body. The rigid part does not also contact with the connecting material. A sectional area of the rigid part is larger in the width direction of the outer electrode than that of each of the fixed part and the free part. Each outer electrode has at least a part where the fixed part, the free part and the rigid part are arranged in order.

As defined above, each outer electrode of the multilayer piezoelectric element according to the present invention has the fixed part, the free part, and the rigid part. The free part has a plurality of the openings (or porous) expandable in the stacked direction of the multilayer ceramic body. The presence of such openings (or porous) can relax the stress which is generated by the displacement of the piezoelectric layers (hereinafter, referred to as "piezoelectric displacement" in short). This can suppress occurrence of breaking and separating the various parts of the outer electrodes and can enhance the performance of the outer electrodes.

The sectional area of the rigid part in the width direction of the outer electrode is larger than that of each of the fixed and the free part. It is possible to increase the current capacity of the outer electrode by forming the rigid part having such a configuration in a part of the outer electrode. This can increase the amount of the displacement of the multilayer piezoelectric element on its working and thereby improve the performance of the multilayer piezoelectric element.

An optional sectional area of each part such as the fixed part, the free art, and the rigid part is compared to each other in the width direction of the outer electrode. When each part has plural parts, the total sectional area of the plural parts is compared to each other.

Further, the width of the connecting material in the width direction of the outer electrode is smaller than that of the outer electrode. Even if the stress generated by the piezoelectric displacement causes breaking the fixed part in the width direction of the outer electrode, the free part and the rigid part which are not fixed to the connection material can keep the electrical connection to the outer electrode (hereinafter, also referred to only as "conductivity" in short). It is thereby possible for the multilayer piezoelectric element to suppress the change of the displacement characteristic of the multilayer piezoelectric element during its working.

Still further, the outer electrode has the part in which the fixed part, the free part, and the rigid part are arranged in order in the width direction of the outer electrode. That is, the presence of the expandable free part placed between the fixed part and the rigid part, which is capable of relaxing the stress to be applied, can suppress the expansion of a broken part in the fixed part. It is possible to prevent breaking the rigid part which is capable of increasing the current capacity and of realizing its performance, and thereby possible to maintain the superior performance of the multilayer piezoelectric element in use for a long period of time.

As described above, the multilayer piezoelectric element according to the present invention has the outer electrodes and each outer electrode has the fixed part, the free part, and the rigid part arranged in order. This configuration enables the outer electrodes to have the improved duration for a long period of time and enables the multilayer piezoelectric element to enhance its performance. In particular, even if the multilayer piezoelectric element is used under strict conditions for a long period of time, it is possible for the multilayer piezoelectric element to keep its displacement characteristic and the like. Such a feature allows that the multilayer piezoelectric element can be applied to high speed devices such as an injector operating at a high speed.

It is also acceptable that each of the fixed part, the free part and the rigid part is composed of a plurality of sub-parts. It is further preferred to continuously form the plural sub-parts of the free part in the stacked direction (which is equal to the longitudinal direction of the outer electrode) of the multilayer piezoelectric element. That is, it is possible to provide the stress relaxing effect by the continuous formation of the sub-parts of the free part in the displacement direction of the piezoelectric layers. Further, it is possible to continuously or separately form the sub-parts of the rigid part in the outer electrode along the stacked direction (as the longitudinal direction of the outer electrode) of the multilayer ceramic body.

It is further preferred that the plural openings in the free part in the outer electrode is arranged in a net structure. This configuration enables the free part to have an improved superior expandable characteristic. The free part further provides the stress relaxing effect, and it is thereby possible to suppress the occurrence of breaking the outer electrodes.

Still further, it is preferred that the fixed part has a plurality of openings (namely, fine holes or porous). This configuration enables that an adhesive agent as the connecting material is entered into the openings in the fixed part. The connecting material and the fixed part are thereby tightly connected together. This can increase the strength of the connection between the outer electrode and the multilayer ceramic body.

Still further, it is preferred that the openings are arranged in a net structure. This configuration enables that the connecting material and the fixed part are tightly fixed together. This can increase the strength of the connection between the outer electrode and the multilayer ceramic body.

Moreover, it is preferred that the openings are produced by one of expanding process, punching process, etching process, and a laser beam process. Those manners can easily form various shapes of the openings. It is acceptable for the openings to have various shapes such as a circular shape, an elliptical shape, a triangle shape and a square shape. In particular, the configuration of the openings in the free part taking a circular shape and an elliptical shape having no corner can further suppress the occurrence of breaking the outer electrode because of hardly concentrating the stress generated by the piezoelectric displacement at the free part.

It is preferred that the rigid part has a plate shape without any openings. This configuration can provide the sectional area of the rigid part as large as possible, and it is thereby possible to increase the current capacity of the outer electrode and to increase the performance of the multilayer piezoelectric element.

It is preferred that the rigid part is formed at the end of each outer electrode in the width direction thereof. This configuration can adequately keep the distance from the fixed part to the rigid part. That is, this configuration can adequately have the width of the free part formed between the fixed part and the rigid part. Thereby, the configuration of such a free part can relax certainly the stress generated by the piezoelectric displacement on working and can suppress the occurrence of breaking the rigid part formed at the outside of the free part.

It is preferred that the entire width Wa of each outer electrode is less than 10.0 mm. When Wa>=10.0 mm, the material cost of producing the outer electrode is increased. In addition, it becomes hard to handle the outer electrode because the total width of the outer electrode becomes larger than that of the multilayer ceramic body.

It is preferred that the width Wr of the rigid part is more than 0.3 mm. When Wt<=0.3 mm, there is a possibility of being impossible to form the rigid part in the outer electrode. When the rigid part is composed of plural sub-parts, the width of the rigid part is determined by the sum of the width of each sub-part.

It is preferred that the width Wf of the free part and the longitudinal length Lp of the multilayer ceramic body satisfy a relationship Wf>0.01 Lp. In general use, such a multilayer ceramic body is expanded by approximately 0.1 to 0.1% thereof. Therefore when Wf<=0.01 Lp, it is difficult to adequately have the width Wf of the free part to the length Lp of the multilayer ceramic body in the stacked direction. Because this configuration of the free part has a poor relaxing effect to the stress to be applied, there is a possibility of causing a fatigue breaking in the outer electrode. In particular, applying the multilayer piezoelectric element to the injector and the like having a large amount of expanding and contracting clearly causes such a phenomenon of fatigue breaking.

When the free part is composed of plural sub-parts, the width of the free part is defined by the sum of the width of each sub-part.

It is further preferred that the sectional area Sr of the rigid part, a maximum driving current Im of the multilayer piezoelectric element, and an allowable current Ia of each outer electrode per unit area satisfy a relationship of (Im/Sr)<Ia. The occurrence of breaking the fixed part and the free part on (Im/Sr)>Ia decreases the current capacity of the outer electrode. Accordingly, in order to eliminate the occurrence of problem even if the entire current (as the maximum driving current Im) flows in the rigid part, it is preferred to form the outer electrode so that the relationship (Im/Sr)>Ia is satisfied. Satisfying the above relationship can eliminate the occurrence of varying the displacement characteristic of the multilayer piezoelectric element on its working. Adequately keeping the sectional area Sr of the rigid part can suppress heat generation while the driving current flow. This feature can suppress the deterioration of the connecting material and can increase the durability of the outer electrodes in the multilayer piezoelectric element.

It is further preferred that each outer electrode is made mainly of one of Cu, Au, and Ag. The use of such a metal can increase the strength of the outer electrode and increase the current capacity of the outer electrode.

It is further preferred that each outer electrode is made mainly of stainless steel and the surface of each outer electrode is plated by one of Cu, Au, and Ag. Performing such a plating can increase the strength of the outer electrode and adequately keep the current capacity on the surface of the outer electrode.

It is further preferred that the connecting material is a conductive adhesion agent. The use of the conductive adhesion agent can adequately keep the electrical conductivity between the inner electrode of the multilayer ceramic body and the outer electrodes, and provides the easy connection working for the outer electrodes on the electrode connecting surfaces.

It is further preferred that the connecting material is solder. The use of solder can adequately keep the electrical conductivity between the inner electrode of the multilayer ceramic body and the outer electrodes, and provides the stronger connection of the outer electrodes on the electrode connecting surfaces.

It is further preferred that the multilayer piezoelectric element according to the present invention is applied to a piezoelectric actuator for use in an injector. The injector is in general used under strict conditions or environments such as at a high temperature under a high pressure. Using the multilayer piezoelectric element of the present invention as an actuator in the injector for vehicles can increase and enhance the durability and reliability thereof and it is therefore possible to increase the entire performance of the injector.

BRIEF DESCRIPTION OF THE DRAWINGS

A preferred, non-limiting embodiment of the present invention will be described by way of example with reference to the accompanying drawings, in which:

FIG. 2 is applied according to the fourth embodiment of the present invention.

DETAILED DESCRIPTION OF THE PREFERRED EMBODIMENTS

Figure 1:
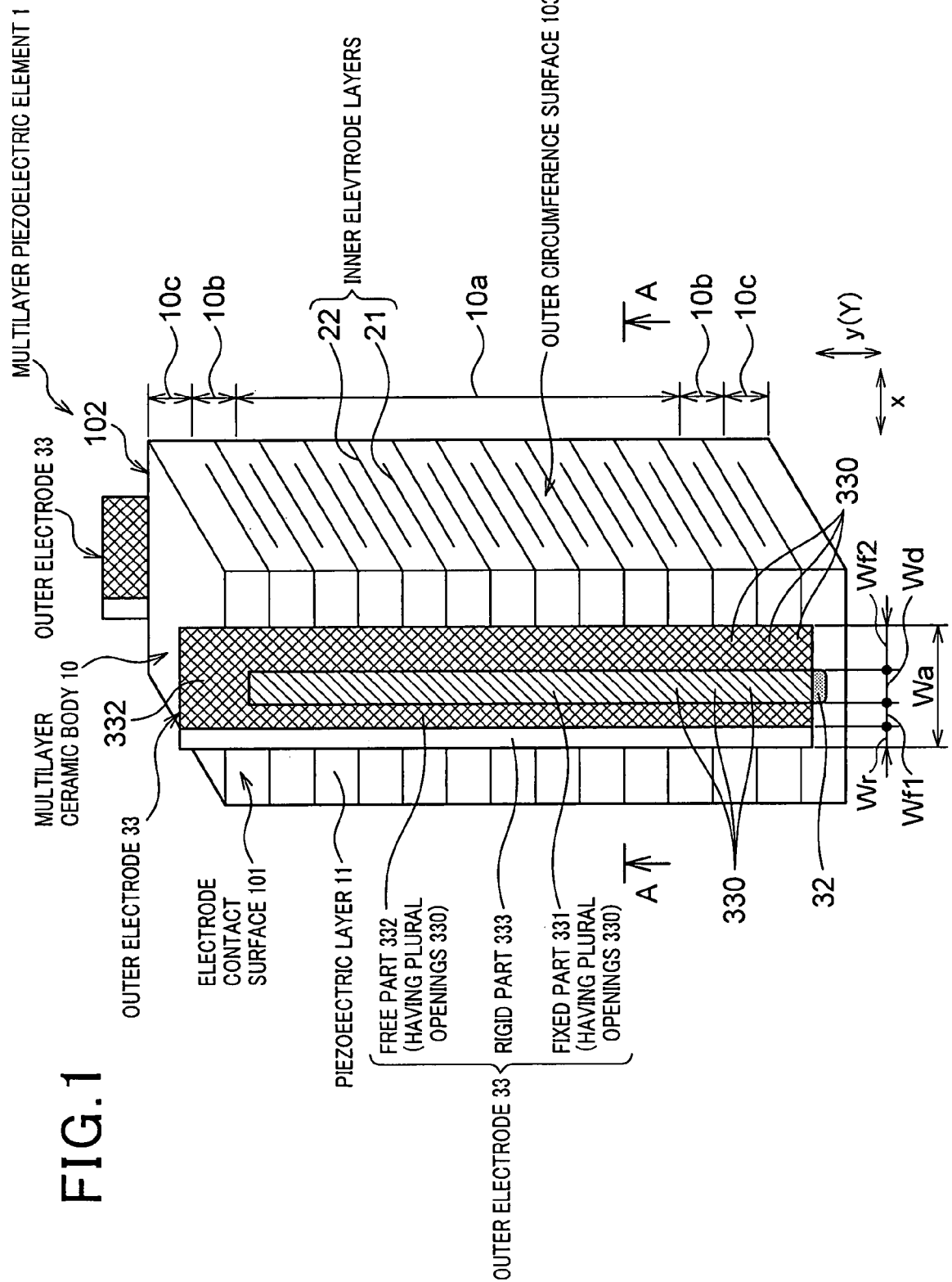
FIG. 1 is a schematic view showing an entire configuration of a multilayer piezoelectric element according to embodiments of the present invention.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of the multilayer piezoelectric element according to the first embodiment of the present invention with reference to FIG. 1 and FIG. 2.

FIG. 1 is a schematic view showing a configuration of the multilayer piezoelectric element according to the first embodiment. FIG. 2 is a sectional view of the multilayer piezoelectric element along A-A line in FIG. 1.

Figure 2:
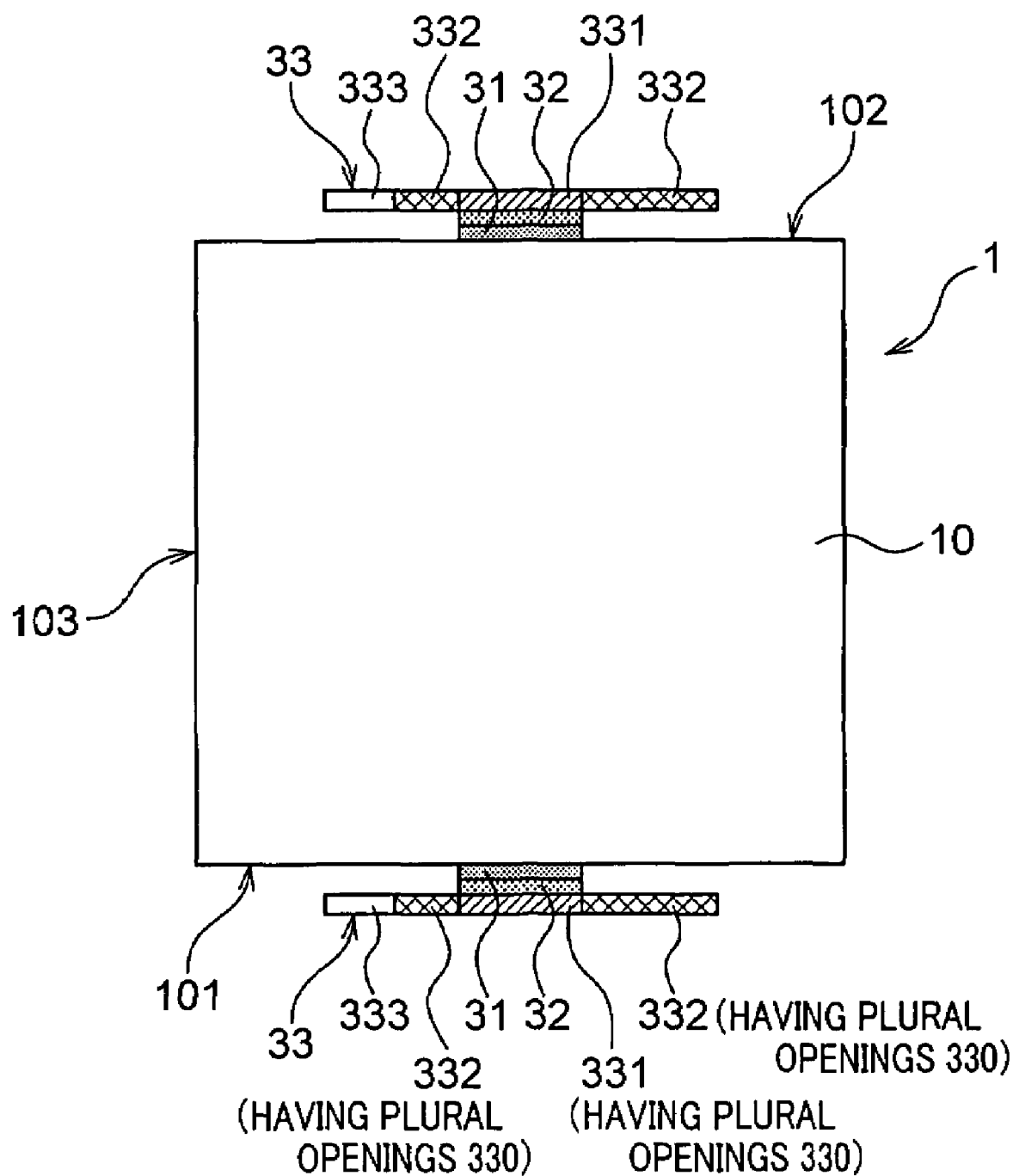
FIG. 2 is a sectional view of the multilayer piezoelectric element along A-A line shown in FIG. 1.

As shown in FIG. 1 and FIG. 2, the multilayer piezoelectric element according to the first embodiment is composed of a multilayer ceramic body 10 and a pair of outer electrodes 33. The multilayer ceramic body 10 is composed of piezoelectric layers 11 made of a piezoelectric material and inner electrodes 21 and 22 made of a conductive material, where the piezoelectric layers 33 and the inner electrodes 21 and 22 are alternately laminated or stacked. A pair of the outer electrodes 33 is so formed that a pair of electrode connecting surfaces 101 and 102 formed on the outer surface 103 of the multilayer ceramic body 10 is electrically contacted to the inner electrode layers 21 and 22.

As shown in FIG. 2, the outer electrodes 33 are electrically connected to the electrode connecting surfaces 101 and 102 through a connecting material 32 of an electrical conductivity whose width is smaller than the width of each outer electrode 33. Each outer electrode 33 is composed of a fixing part 331, a free part 332, and a rigid part 333. The fixing part 331 is contacted with the connecting material 32. The free part 332 has a plurality of openings 330 (or fine-sized holes, or porous) are extendable in stacked direction Y of the multilayer ceramic body 10 (hereinafter, also referred to as "stacked direction Y" in short). The rigid part 333 does not contact with the connecting material 32, and a sectional area of the rigid part 333 is larger than that of each of the fixing part 331 and the free part 332. The outer electrode 33 has at least one part where the fixing part 331, the free part 332, and the rigid part 333 are formed in order in the width direction of the outer electrode 33.

Hereinafter, a description will now be given of the configuration of the outer electrode 33 in detail.

As shown in FIG. 1 and FIG. 2, the multilayer ceramic body 10 of a square column shape in the multilayer piezoelectric element 1 has a square shaped cross section in which a pair of the electrode connecting surfaces 101 and 102 is formed on the outer surface area 103 so that the electrode connecting surfaces 101 and 102 are faced to each other. It is also acceptable that the multilayer ceramic body 10 has a barrel shape, a circular cross section, an octagon cross section, and the like in addition to a square cross section according to usage or application.

The ceramic body 10 has a multilayer structure where the piezoelectric layer 11 and the inner electrode layers 21 and 22 are laminated alternately, as shown in FIG. 1. A part of the outer circumference of the inner electrode layer 21 and a part of the outer circumference of the inner electrode layer 22 are alternately exposed on a pair of the electrode connecting surfaces 101 and 102. On the other hand, a part of the outer circumference part of the inner electrode layer 21 and a part of the outer circumference part of the inner electrode layer 22 are placed as a stay part 19 at the inside of the outer circumference surface 103 of the multilayer ceramic body 10. That is, the multilayer ceramic body 10 has an electrode stay construction (as a partial electrode construction) in order to keep electrical insulation of the inner electrode layers 21 and 22 from outside devices and elements (not shown) at the outer circumference surface 103 of the multilayer ceramic body 10.

The multilayer ceramic body 10 is composed of a driving part 10a formed at an intermediate part in the stacked direction or the lamination direction, a pair of buffer parts 10b and a pair of dummy parts 10c. In multilayer ceramic body 10, the driving part 10a is placed between a pair of the buffer parts 10b, and the driving part 10a and a pair of the buffer parts 10b are placed between a pair of the dummy parts 10c, as shown in FIG. 1.

A magnitude of expansion in each of the driving part 10a, the buffer parts 10b, and the dummy parts 10c is decreased in order. In a concrete example, the thickness of the piezoelectric layer 11 of each of the driving part 10a, the buffer parts 10b, and the dummy parts 10c is increased in order The piezoelectric layer 11 is composed of piezoelectric ceramics made of Lead zirconate titanate (or PZT). The inner electrode layers 21 and 22 are made of an alloy of Ag and Pd. It is also acceptable to use one of Ag, Pd, Cu, Ni, an alloy of Cu and Ni, and the like in order to make the inner electrodes 21 and 22.

As shown in FIG. 2, the inner electrode layers 21 and 22 are exposed on the electrode connecting surface 101 and 102 in the multilayer ceramic body 10, respectively. A side electrode 31 is formed on each of the electrode connecting surface 101 and 102 so as to electrically contact the end part of each of the inner electrode layers 21 and 22 with the side electrode 31. The connecting material 32 is formed on the side electrode 31. Through the connecting material 32, the outer electrode 33 is electrically connected to the side electrodes 31 of each of the inner electrode layers 21 and 22.

The outer circumference surface 103 of the multilayer ceramic body 10 is covered with molding material (not shown).

Each side electrodes 31 is formed on the multilayer ceramic body 10 in the first embodiment by baking Ag paste made of Ag (97 wt %) and glass frit (3 wt %). It is possible to use various pastes such as Ag/Pd, Pt, Cu, Ni, and Au instead of Ag paste.

The bonding material 32 is made of conductive adhesive agent involving Ag filler in epoxy resin. It is possible to use solder instead of such a conductive adhesive agent. The molding material is made of silicon resin as insulating resin.

A description will now be given of the outer electrodes 33 in detail.

Each outer electrode 33 is made of stainless steel (SUS304) which is plated with Ni as a foundation, and Ag is plated on the Ni plating. It is also possible to plating Cu, Ag and the like instead of Ag. It is also possible to form the entire of the outer electrode 33 with Cu, Au, Ag and the like.

As shown in FIG. 1 and has been described, the outer electrode 33 is electrically contacted with the bonding material 32 made of conductive adhesive agent. The width Wd of the bonding material 32 is smaller than the width Wa of the outer electrode 33. In the first embodiment, the width Wd of the bonding material 32 is 1.2 mm, and the width Wa of the outer electrode 33 is 3.0 mm.

Each outer electrode 33 is composed of the fixing part 331 contacted with the bonding material 32, the free part 332 which is not contacted with the bonding material 32, and the rigid part 333.

The fixing part 331 and the free part 332 have a plurality of the openings 330 (or porous) in mesh pattern of a rhombic shape. In the first embodiment, the openings 330 are formed by expanding process. It is acceptable to use another process of forming the openings 330, for example, punching process, etching process, or laser beam machining process instead of expanding process.

The rigid part 333 has a plate shape without any opening 330, which is different in configuration from both the fixing part 331 and the free part 332. Accordingly, the rigid part 333 has a larger sectional area in width direction than that of each of the fixing part 331 and the free part 332. As shown in FIG. 2, at an optional cross section in width direction of the outer electrode 33, the sectional area Sd of the fixing part 331 is 0.04 mm$^2$, and the sectional area Sf of the free part 332 is 0.04 mm$^2$, and the sectional area Sr of the rigid part 333 is 0.05 mm$^2$.

The fixing part 331 is continuously formed in the longitudinal direction "y" (hereinafter, referred to as the length direction "y" in short) at the middle part in the width direction "x" (see FIG. 1). The conductive adhesive agent as the bonding material 32 is entered into the openings 330 in the fixing part 331 so that the bonding material 32 and the outer electrode 33 are tightly fixed to each other. Thus, the outer electrode 33 is tightly fixed to the multilayer ceramic body 10 by the fixing part 331. The width Wd of the fixing part 331 is 1.2 mm which is the same as that of the bonding material 32.

One end of the rigid part 333 in the width direction "x" of the outer electrode 33 is continuously formed in the longitudinal direction "y". The width Wr of the rigid part 333 is 0.5 mm.

The part other than the fixing part 331 and the rigid part 333 is the free part 332 which is not contacted with the bonding material 32. Because having a plurality of the openings 330 therein, the free part 332 in expandable in the longitudinal direction "y", namely, in the lamination direction "Y" (see FIG. 1).

In the configuration of the first embodiment, because the free part 332 is formed both sides of the fixing part 331, the width Wf of the free part 332 can be obtained by adding Wf1+Wf2(Wf=Wf1+Wf2), as shown in FIG. 1. The width Wf of the free part 332 in the first embodiment is 1.3 mm.

There is the part where the fixing part 331, the free part 332, and the rigid part 333 forming the outer electrode 33 are placed in order in the width direction "x". When the length of the multilayer ceramic body 10 in the lamination direction Y is Lp, the relationship Wf>0.01 LP is satisfied. In the first embodiment, the length Lp of the multilayer ceramic body 10 is 30.0 mm.

The relationship Im/Sr<Ia is satisfied in the rigid part 333, where the sectional area of the rigid part 333 is Sr, the maximum diving current flowing through the multilayer piezoelectric element 1 is Im, an allowable current per unit area of the outer electrode 33 is Ia. As a concrete example in the first embodiment, Sr is 0.05 mm$^2$, Im is 20.0 A, and Ia is 420.0 A/mm$^2$.

Next a description will now be given of a brief explanation of producing method of the multilayer piezoelectric element 1 of the first embodiment of the present invention.

It is possible to produce the multilayer piezoelectric element 1 of the first embodiment by well-known green sheep manner.

At first, main raw materials as piezoelectric material are prepared, which are composed mainly of lead oxide, zirconium oxide, titanium oxide, niobium oxide, and strontium carbonate in a specified percentage composition of the mixture. Because lead component in lead oxide is evaporated at a high temperature, the amount of lead oxide is about 1% to 2% rich of a stoichiometric composition. The mixture of the raw materials prepared is mixed without adding any water by a mixer, and the mixed powder obtained is fired at a high temperature within a range of 800 to 950° C.

Following the firing step, pure water and dispersing agent are added into the mixed powder in order to make slurry. The slurry is powdered in wet milling by a pearl mill. The milled slurry is dried and degreased. After this step, solvent, binder, plasticization agent (or plasticize), dispersing agent are added into the slurry. The slurry is then mixed by a ball mill. The slurry is then set in a vacuum apparatus, and then agitated in the vacuum apparatus by an agitator apparatus so as to perform vacuum degassing and viscosity adjustment.

Following, the slurry is formed in a green sheet of a specified thickness by a doctor blade apparatus. The green sheet formed is punched by a press machine or cut by a cutter in order to obtain the green sheet of a specified length. It is also acceptable to use another manner other than the doctor blade manner, for example, extrusion molding manner and other manners. Then, Ag/Pd paste is applied, by screen process printing, onto a part of the surface of the green sheet which will become the piezoelectric layer 11, where the inner electrodes 21 and 22 are formed at the part, and Ag/Pd paste is composed of Ag (70 wt %) and Pd (30 wt %). At this time, the electrode stay part (as the electrode stay structure) is also formed, where the inner electrode layers 21 and 22 are not formed.

A specified number of the green sheets to be stacked or laminated are prepared according to the specification for the amount of displacement by the driving part 10a and the buffer part 10b. In addition, a specified number of the green sheets having no inner electrode layers 21 and 22 are also prepared for the buffer part 10b and the dummy part 10c.

Following, a plurality of the green sheets prepared are stacked so that the electrode stay part (not shown) is alternately positioned between the electrode connecting surfaces 101 and 102. Thereby, the inner electrode layers 21 and 22 are alternately exposed on the electrode connecting surfaces 101 and 102.

The green sheets for the driving part 10a are firstly stacked, and the green sheets for the buffer parts 10b are then stacked on both the surfaces of the stacked green sheets for the driving part 10a. Finally, the green sheets for the dummy parts 10c are stacked on both the end surfaces of the stacked green sheets for the driving part 10a in order to obtain a multilayer intermediate body shown in FIG. 1.

Following, the multilayer intermediate body is pressed by a specified pressure while heating and then degreased at a specified temperature within a range of 400 to 700° C., and fired at a specified temperature within a range of 900 to 1200° C. The multilayer ceramic body 10 is thereby obtained.

Next, Ag paste is applied on the electrode connecting surfaces 101 and 102 of the multilayer ceramic body 10. The multilayer ceramic body 10 is then baked in order to obtain the side electrodes 31.

The bonding material 32 made of conductive adhesion agent is then applied on the side electrodes 31. The outer electrodes 33 are formed on the bonding material 32 applied.

At this time, the outer electrodes 33 are placed so that the bonding material 32 is entered into the openings 330 of the outer electrodes 33. After this process, the bonding material 32 is hardened by heating it so as to join the outer electrodes 33 to the multilayer ceramic body 10.

Finally, the entire of the outer circumference surface 103 of the multilayer ceramic body 10 is molded with mold material (omitted from the drawings) made of insulation resin. The multilayer piezoelectric element 1 shown in FIG. 1 and FIG. 2 is thereby obtained.

Next, a description will now be given of action and effects of the multilayer piezoelectric element 1 obtained by the above production manner according to the first embodiment of the present invention.

Each outer electrode 33 in the multilayer piezoelectric element 1 has the fixed part 331, the free part 332, and the rigid part 333.

The free part 332 has a plurality of the openings 330 which are expandable in the lamination direction Y (or in the stacked direction Y) of the multilayer ceramic body 10. This configuration can relax the stress generated by piezoelectric displacement and applied to the outer electrodes 33. It is thereby possible to suppress occurrence of breaking and separating the outer electrodes 33 from the multilayer ceramic body 10 and to increase the durability of the outer electrodes 33.

The rigid part 333 is relatively large in sectional area in the width direction "x" of the outer electrode 33 than the fixed part 331 and the free part 332. It is possible to increase the current capacity of the outer electrode 33 by forming such a rigid part 333 at a part of the outer electrode 33. It is thereby possible to increase the amount of displacement in the multilayer piezoelectric element 1 during its working. This can enhance the performance of the multilayer piezoelectric element 1.

As shown in FIG. 2, the bonding material 32 is smaller in width than the outer electrode 33. Even if the fixed part 332 which is fixed to the bonding material 32 is broken in the width direction "x" by the stress generated by the piezoelectric displacement, it is possible to keep the electric conductivity between the inner electrodes 21 and 22 and the outer electrodes 33 by the free part 332 and the rigid part 333 which are not fixed to the bonding material 32. It is thereby possible to suppress any change of the displacement characteristic of the multilayer piezoelectric element 1 during its working.

The outer electrode 33 has a part in which the fixed part 331, the free part 332, and the rigid part 333 are arranged in order in the width direction "x" of the outer electrode 33. It is possible to suppress expanding of the broken part occurred in the fixed part 331 by forming the free part 332, which is capable of relaxing the stress to be applied, between the fixed part 331 and the rigid part 333. This configuration can prevent any occurrence of breaking the rigid part 333 capable of increasing the current capacity and performance of the multilayer piezoelectric element 1. The configuration of the multilayer piezoelectric element 1 described above can maintain the performance of the multilayer piezoelectric element 1 for a long period of time.

In the configuration of the first embodiment, because each opening 330 formed in the free part 332 has a mesh-shape configuration, it is possible to increase the expansion capability of the free part 332, and thereby to enhance the stress relaxation capability of the free part 332. This can further suppress the occurrence of breaking the outer electrodes 33.

The fixed part 331 has a plurality of the openings 330, like the configuration of the free part 332. Because each opening 330 formed in the fixed part 331 has a mesh-shape configuration, it is possible to insert the bonding agent 32 into the openings 330 of the fixed part 331 so as to tightly fix them together. This configuration can increase the bonding strength between the outer electrodes 33 and the multilayer ceramic body 10.

The rigid part 333 has a plane shape and does not have any openings 330. It is thereby possible to keep the sectional area of the rigid part 333 as large as possible when compared with the sectional area of each of the fixed part 331 and the free part 332. This configuration can further increase the performance of the current capacity of and the performance of the bonding strength of the outer electrodes 33.

Because the rigid part 333 is formed at the end part in the width direction of the outer electrode 33, it is possible to adequately place the free part 332 within the width direction of the outer electrode 33. This configuration enables the free part 332 to relax the stress generated by the piezoelectric displacement and also enables the rigid part 333 formed at the outside of the free part 332 to break.

Further, when the width of the free part 332 is Wf and the length of the free part 332 in the stacked direction Y of the multilayer ceramic body 10 is Lp, the relationship Wf>0.01 Lp is satisfied. It is thereby possible for the free part to adequately relax the stress applied to the outer electrodes 33 by the piezoelectric displacement.

Still further, when the sectional area of the rigid part 333 is Sr, the maximum driving current in the multilayer piezoelectric element 1 is Im, the allowable current per unit area of the outer electrode 33 is Ia, the relationship (Im/Sr)<=Ia is satisfied. According to this configuration, even if breaking of the fixed part 331 and the free part 332 in the outer electrode 33 occurs and all amount of the current flows only through the rigid part 333, it is possible to suppress the variation of the displacement characteristic of the multilayer piezoelectric element 1 is not changed during working.

Still furthermore, because the sectional area Sr of the rigid part 333 is adequately kept in the outer electrode 33, it is possible to suppress the generation of heat when a current flows, and thereby possible to suppress the deterioration of the bonding material 32, and thereby possible to enhance the durability of the outer electrodes 33.

Moreover, because the outer electrode 33 is made mainly of stainless steel and the surface of the outer electrode 33 is plated with silver Ag, it is possible to increase the strength of the outer electrode 33. The Ag plating enables the outer electrode 33 to increase its current capacity.

Furthermore, in the first embodiment, because conductive adhesive agent is used as the bonding material 32, it is possible to insert the bonding material 32 into the openings 330 in the fixed part 331 so as to tightly fix the bonding material 32 and the outer electrode 33 together. This configuration enables the outer electrode 33 to have a higher bonding strength. It is also possible to easily connect the outer electrode 33 to the multilayer ceramic body 10, and also possible to adequately keep the electric conductivity between the inner electrodes 21 and 22 and the outer electrodes 33.

According to the multilayer piezoelectric element 1 of the first embodiment has the configuration in which each outer electrode 33 is composed of the fixed part 331, the free part 332, and the rigid part 333 placed in such an arrangement. It is thereby possible to increase both the durability of and the performance of the outer electrode 33 simultaneously. Even if the multilayer piezoelectric element 1 is used under strict conditions for a long period of time, it is possible to maintain the displacement characteristic thereof.

Second Embodiment

A description will be given of the second embodiment according to the present invention. In the second embodiment, the multilayer piezoelectric element 1 of the first embodiment was evaluated in durability and reliability.

In the second embodiment, the sectional area Sr of the rigid part 333 in the outer electrode 33 was changed in order to obtain the failure rate of the multilayer piezoelectric element 1.

The evaluation for the failure rate of the multilayer piezoelectric element 1 was performed under following conditions. A driving current is supplied to the multilayer piezoelectric element 1 by supplying a voltage of a trapezoidal pulse whose rising time is 0.1 ms, whose maximum voltage is 150 V, and whose falling time becomes 0.1 ms and the multilayer piezoelectric element 1 is vibrated $10^9$ times at 100 Hz.

Figure 3:
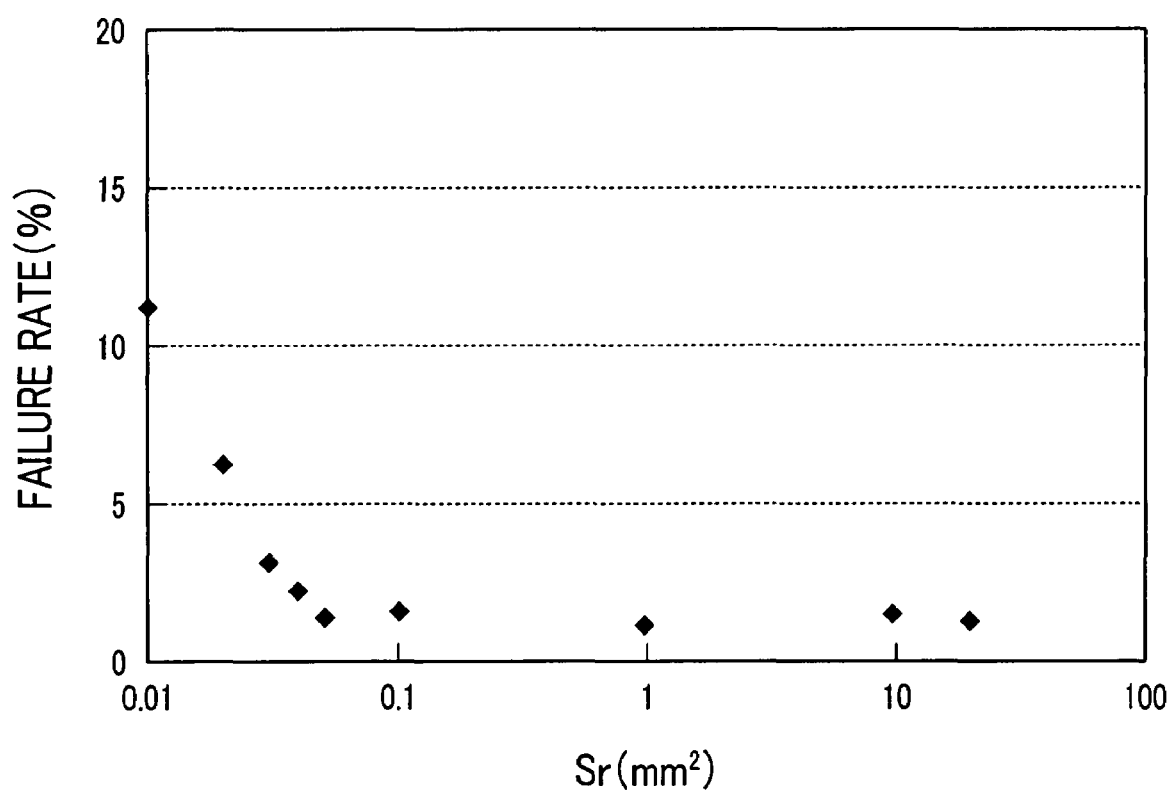
FIG. 3 is a graph showing failure rate of a multilayer piezoelectric element according to the second embodiment of the present invention.

FIG. 3 is a graph showing the obtained failure rate of the multilayer piezoelectric element 1. In FIG. 3, the vertical line indicates the failure ratio (%), and the horizontal line designates the sectional area Sr ($mm^2$) of the rigid part 333.

As can be understood from FIG. 3, the more the sectional area Sr of the rigid part 333 in the outer electrode 33 is, the less the failure ratio becomes drastically. It can be understood and considered from the experimental result shown on FIG. 3 that the increase of the sectional area of the rigid part 333 can suppress the generation of heat caused by flowing a large current. It is thereby possible to suppress the deterioration of the bonding material 32 and to increase the durability of the outer electrode 33.

Third Embodiment

A description will be given of various configurations of the outer electrode 33 in the multilayer ceramic body 10 of the multilayer piezoelectric element 1 according to the third embodiment with reference to FIG. 4 to FIG. 12.

Figure 4:
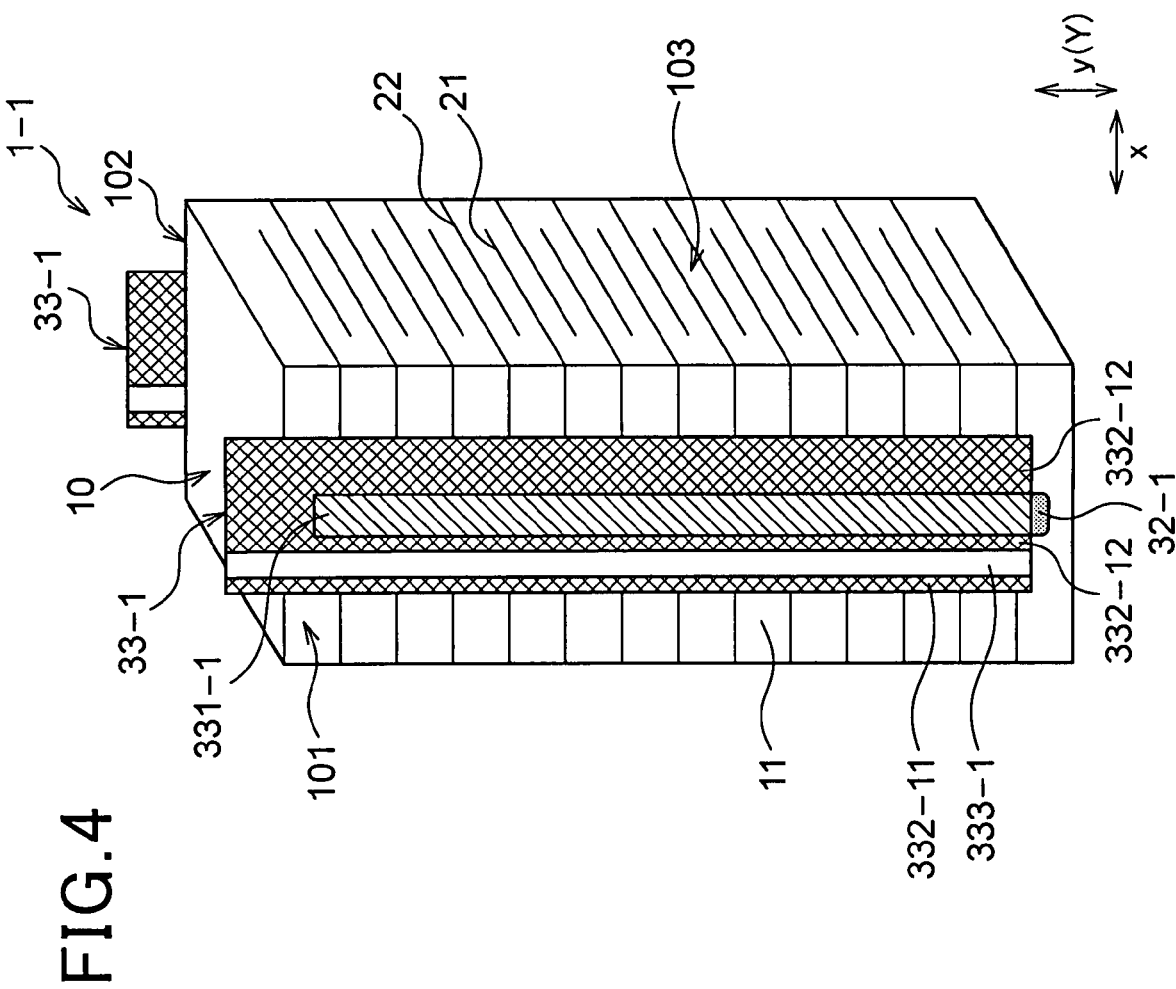
FIGS. 4 to 12 are schematic views, each view showing another configuration of the multilayer piezoelectric element according to the third embodiment of the present invention.

FIG. 4 is a schematic view showing another configuration of the multilayer piezoelectric element according to a third embodiment of the present invention. In the configuration of the multilayer piezoelectric element 1-1 shown in FIG. 4, the fixed part 331-1 is formed at the center part in the width direction "x" of the outer electrode 33-1, and the rigid part 333-1 is slightly shifted from the one end of the outer electrode 33-1 toward the inside of the direction "x". The free part is divided into two parts 332-11 and 332-12. This configuration provides that the free parts 332-11 and 332-12 are formed at both the ends of the rigid part 333-1. The configuration shown in FIG. 4 can prevent occurrence of breaking the rigid part 333-1.

Figure 5:
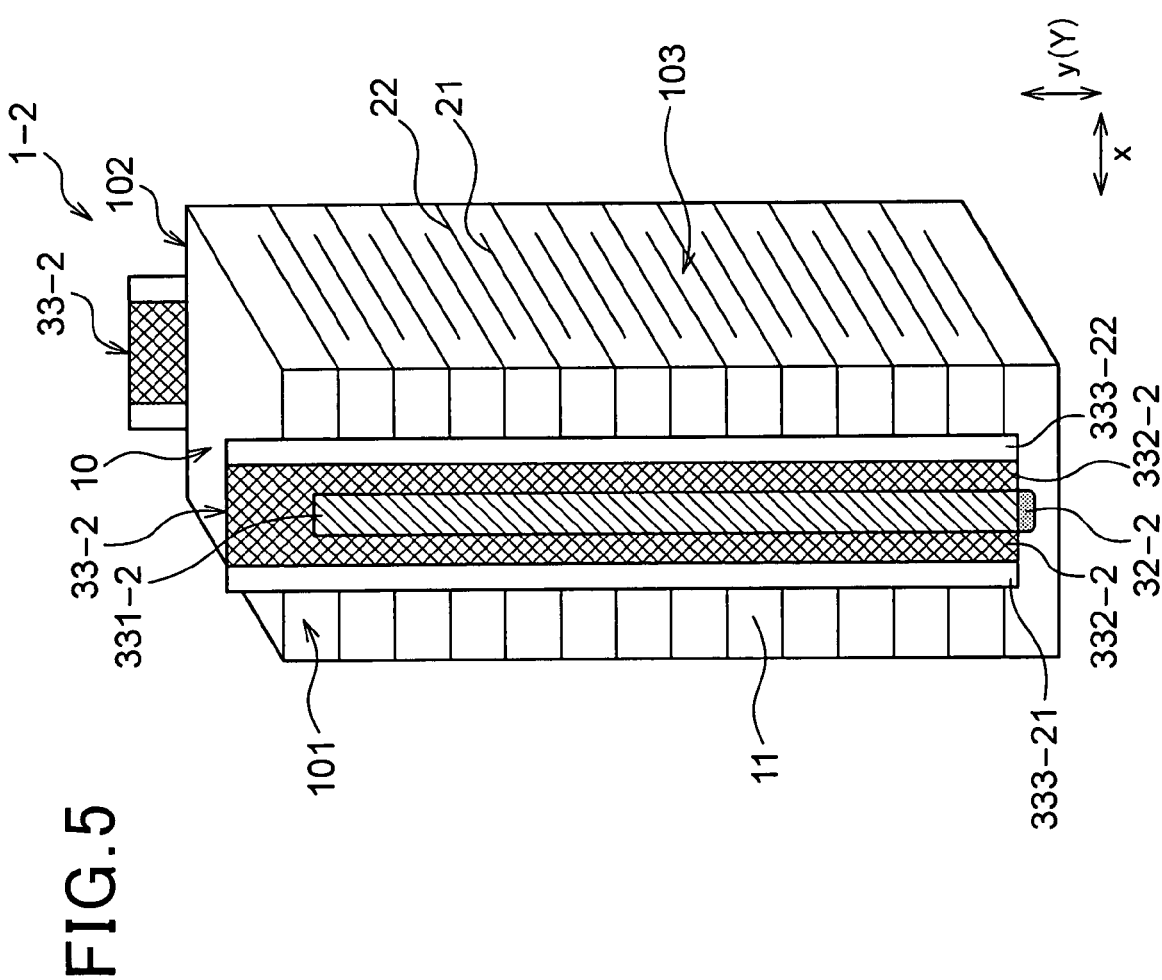

FIG. 5 is a schematic view showing another configuration of the multilayer piezoelectric element according to the third embodiment of the present invention. In the configuration of the multilayer piezoelectric element 1-2 shown in FIG. 5, the fixed part 331-2 is formed at the middle part of the outer electrode 33-2 in the width direction "x", and the rigid part is divided into two parts 333-21 and 333-22 which are formed at both the ends of the outer electrode 33-2 This configuration can provide the rigid parts 333-21 and 333-22 of a large sectional area Sr and increase the current capacity of the outer electrode 33. It is thereby possible to further increase the performance of the multilayer piezoelectric element 1-2.

Figure 6:
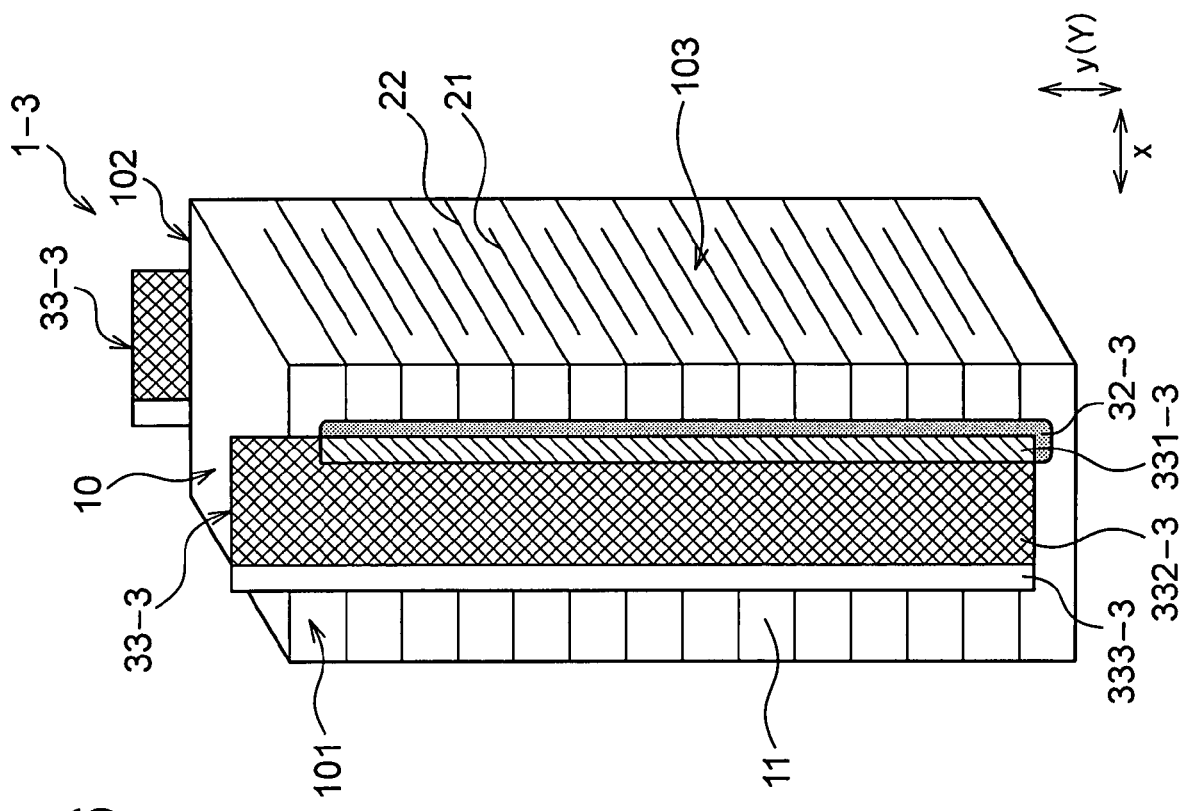

FIG. 6 is a schematic view showing another configuration of the multilayer piezoelectric element according to the third embodiment of the present invention. In the configuration of the multilayer piezoelectric element 1-3 shown in FIG. 6, the fixed part 331-3 is formed at one end of the outer electrode 33-3 in the width direction "x", and the rigid part 333-3 is formed at the other end of the outer electrode 33-3 in the width direction "x". This configuration of the outer electrode 33-3 can further relax the stress generated by the piezoelectric displacement because a large width Wf of the free part 332-3 can be formed.

Figure 7:
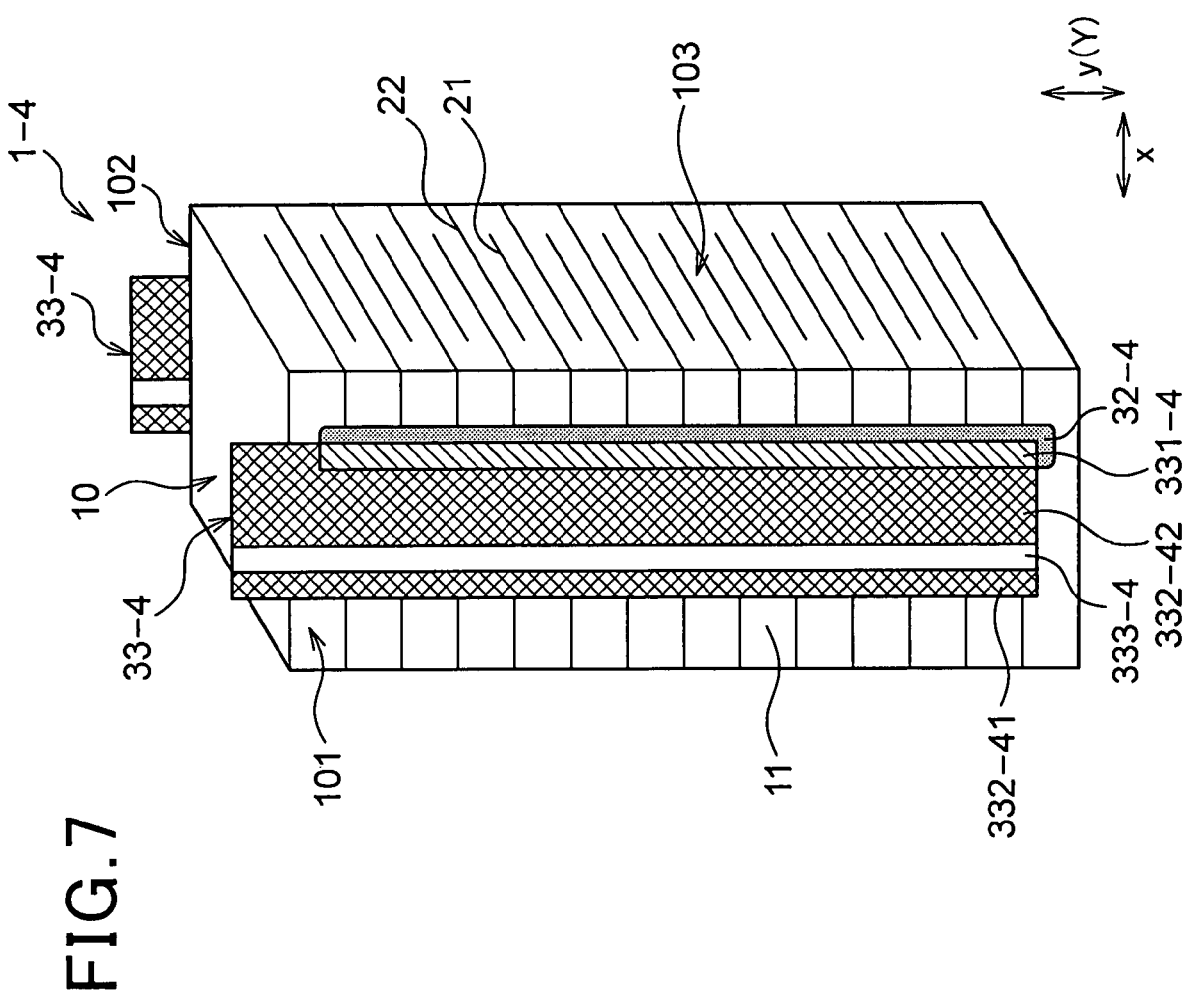

FIG. 7 is a schematic view showing another configuration of the multilayer piezoelectric element according to the third embodiment of the present invention. In the configuration of the multilayer piezoelectric element 1-4 shown in FIG. 7, the fixed part 331-4 is formed at one end of the outer electrode 33-4 in the width direction "x", and the rigid part 333-4 is formed at a slight inside area on the other end of the outer electrode 33-4 in the width direction "x". The free part is divided into the two parts 332-41 and 332-42. This configuration of the outer electrode 33-4 can further relax the stress generated by the piezoelectric displacement because the free part 332-42 having a large width Wf can be formed. Further, because the free parts 332-41 and 332-42 are formed at both ends of the rigid part 333-4, it is possible to prevent occurrence of breaking the rigid part 333-4.

Figure 8:
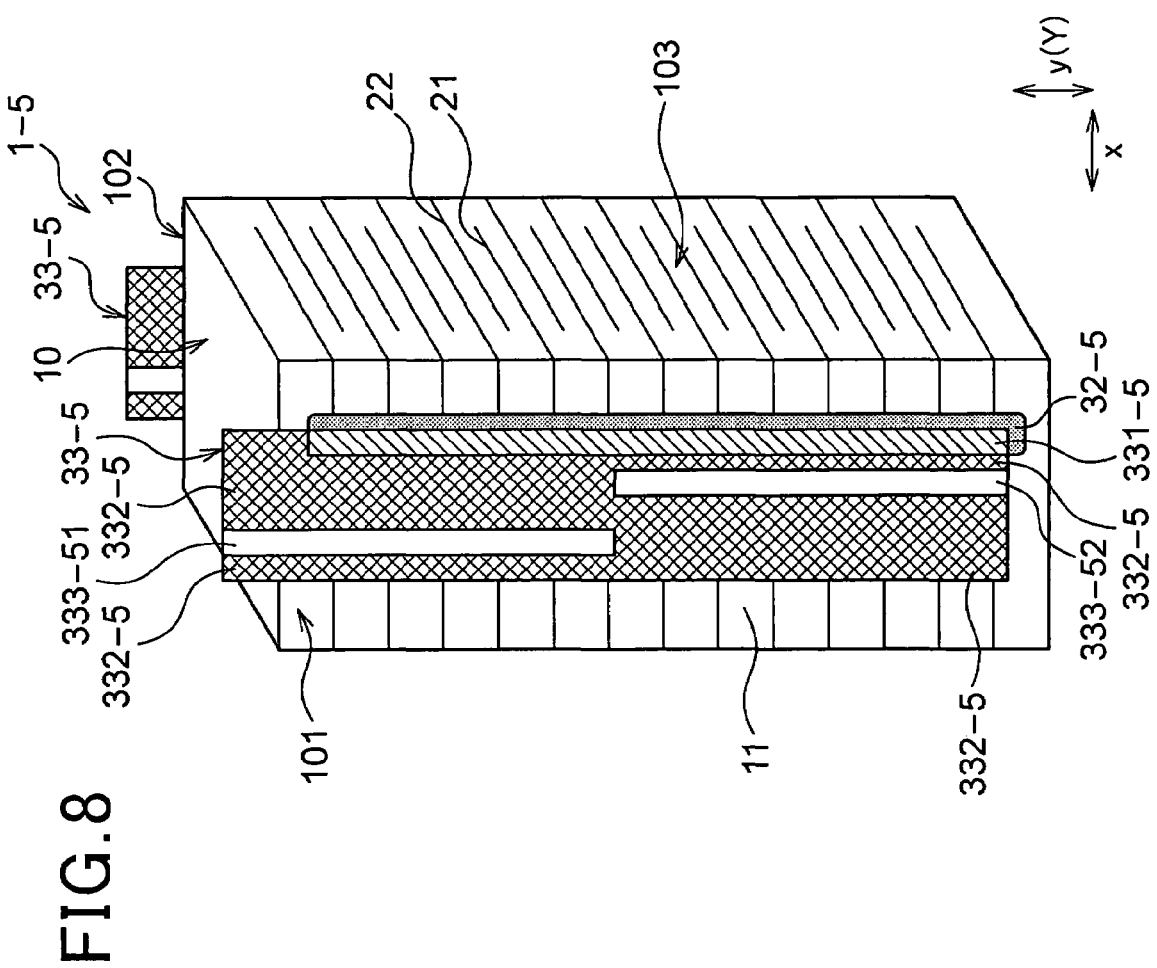

FIG. 8 is a schematic view showing another configuration of the multilayer piezoelectric element according to the third embodiment of the present invention. In the configuration of the multilayer piezoelectric element 1-5 shown in FIG. 8, the fixed part 331-5 is formed at one end of the outer electrode 33-5 in the width direction "x", and the rigid part is divided into two parts, the upper rigid part 333-51 and the bottom rigid part 333-52. The upper rigid part 333-51 and the bottom rigid part 333-52 are shifted to each other in the width direction "x" of the outer electrode 33-5.

Figure 9:
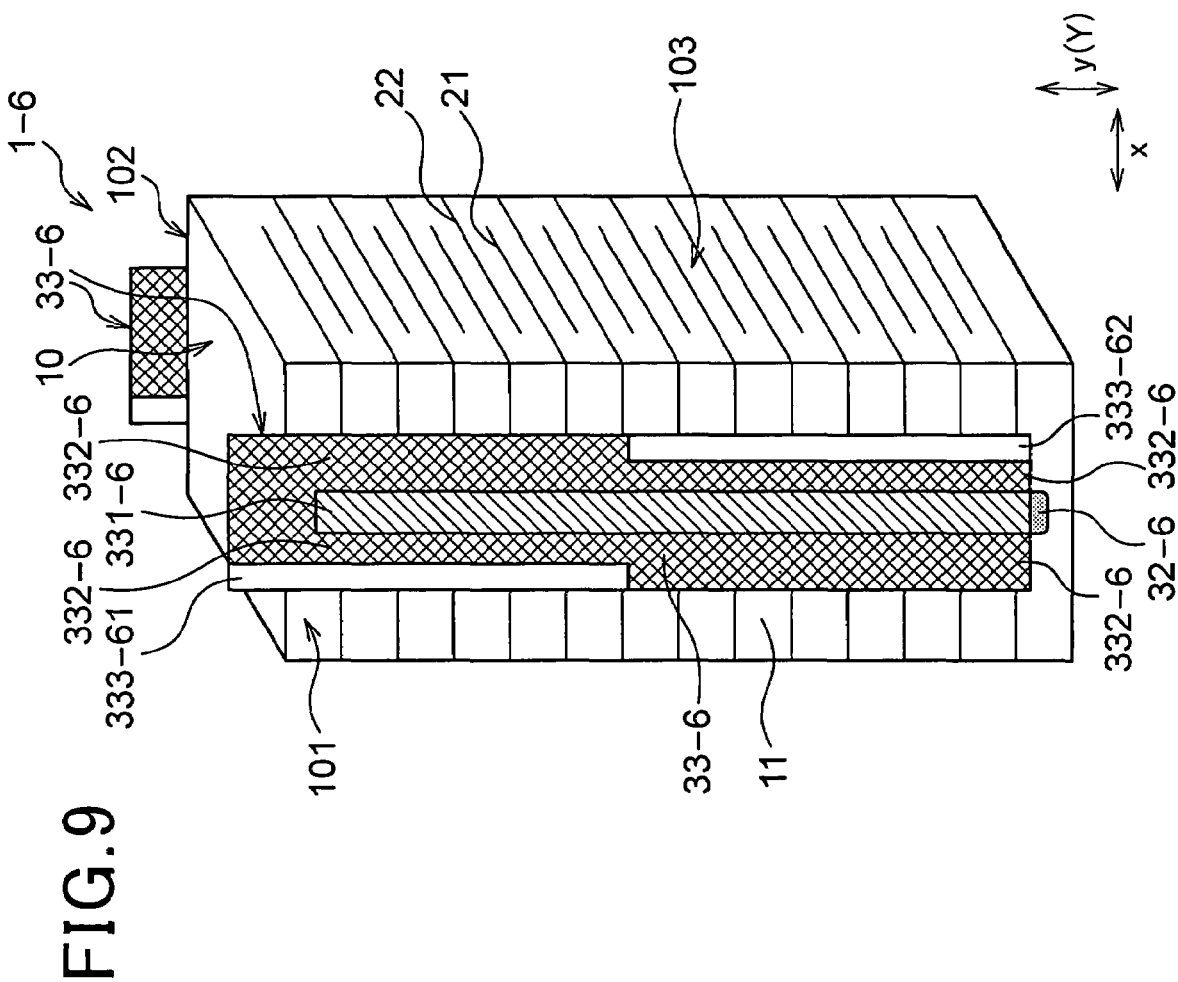

FIG. 9 is a schematic view showing another configuration of the multilayer piezoelectric element according to the third embodiment of the present invention. In the configuration of the multilayer piezoelectric element 1-6 shown in FIG. 9, the fixed part 331-6 is formed at the middle part of the outer electrode 33-6 in the width direction "x", and the rigid part 333-6 is divided into two parts, the upper rigid part 333-61 and the bottom rigid part 333-62. The upper rigid part 333-61 and the bottom rigid part 333-62 are shifted to each other in the width direction "x" of the outer electrode 33-6. In this configuration, because the rigid part has the characteristic of being hard to expand is divided in the two parts, the upper rigid part 333-61 and the lower rigid part 333-62 in the longitudinal direction "y", it is possible to relax the stress generated by the piezoelectric displacement by the presence of those two parts, the upper rigid part 333-61 and the lower rigid part 333-62.

It is possible to prevent the occurrence of breaking the rigid part even if a large expansion amount is generated in the multilayer ceramic body 10 having a longer length.

Figure 10:
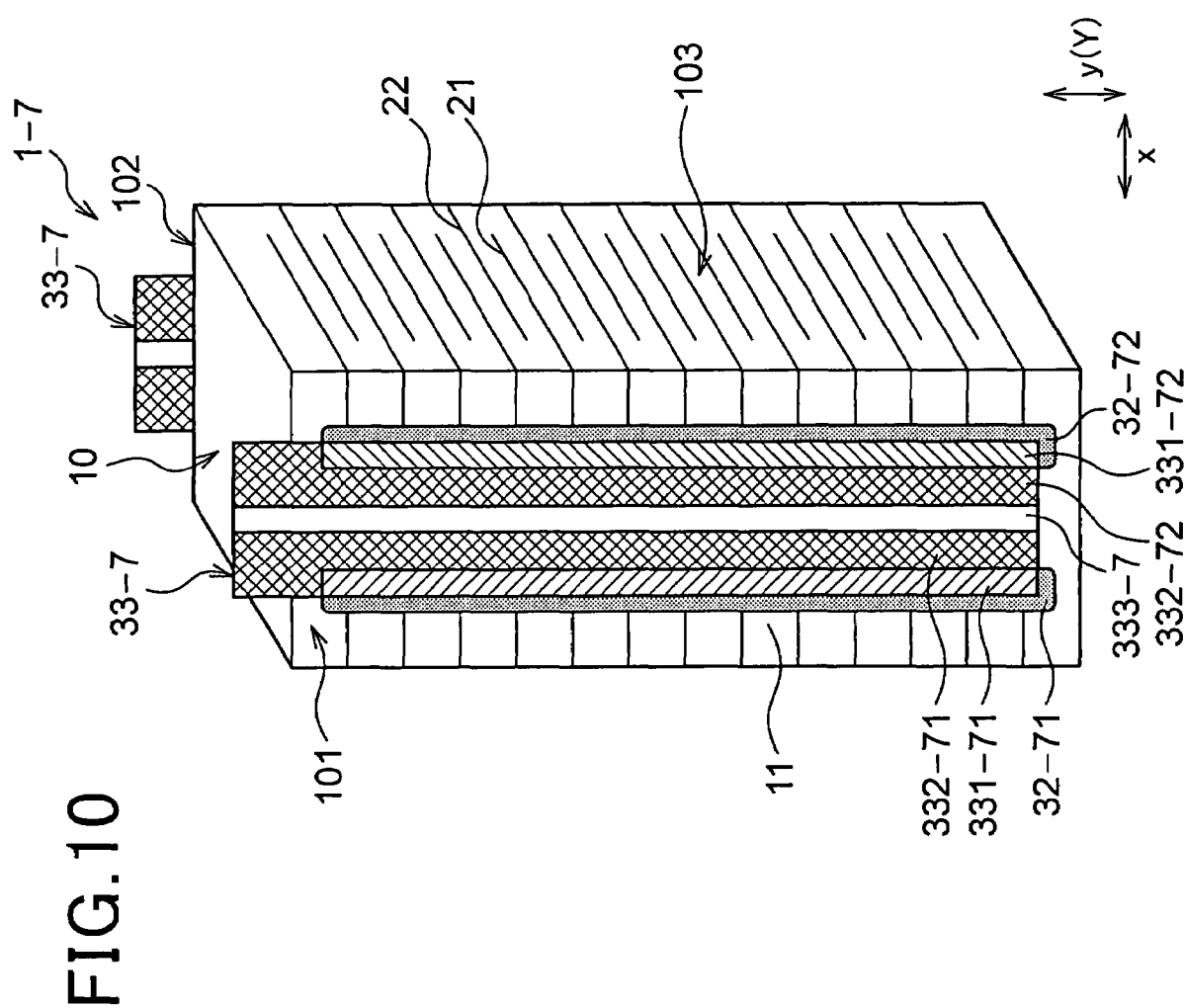

FIG. 10 is a schematic view showing another configuration of the multilayer piezoelectric element according to the third embodiment of the present invention. In the configuration of the multilayer piezoelectric element 1-7 shown in FIG. 10, the fixed part is divided into the two parts 331-71 and 331-72. Similarly, the free part is divided into the two parts 332-71 and 332-72. In particular, the rigid part 333-7 is formed at the middle part of the outer electrode 33.

Figure 11:
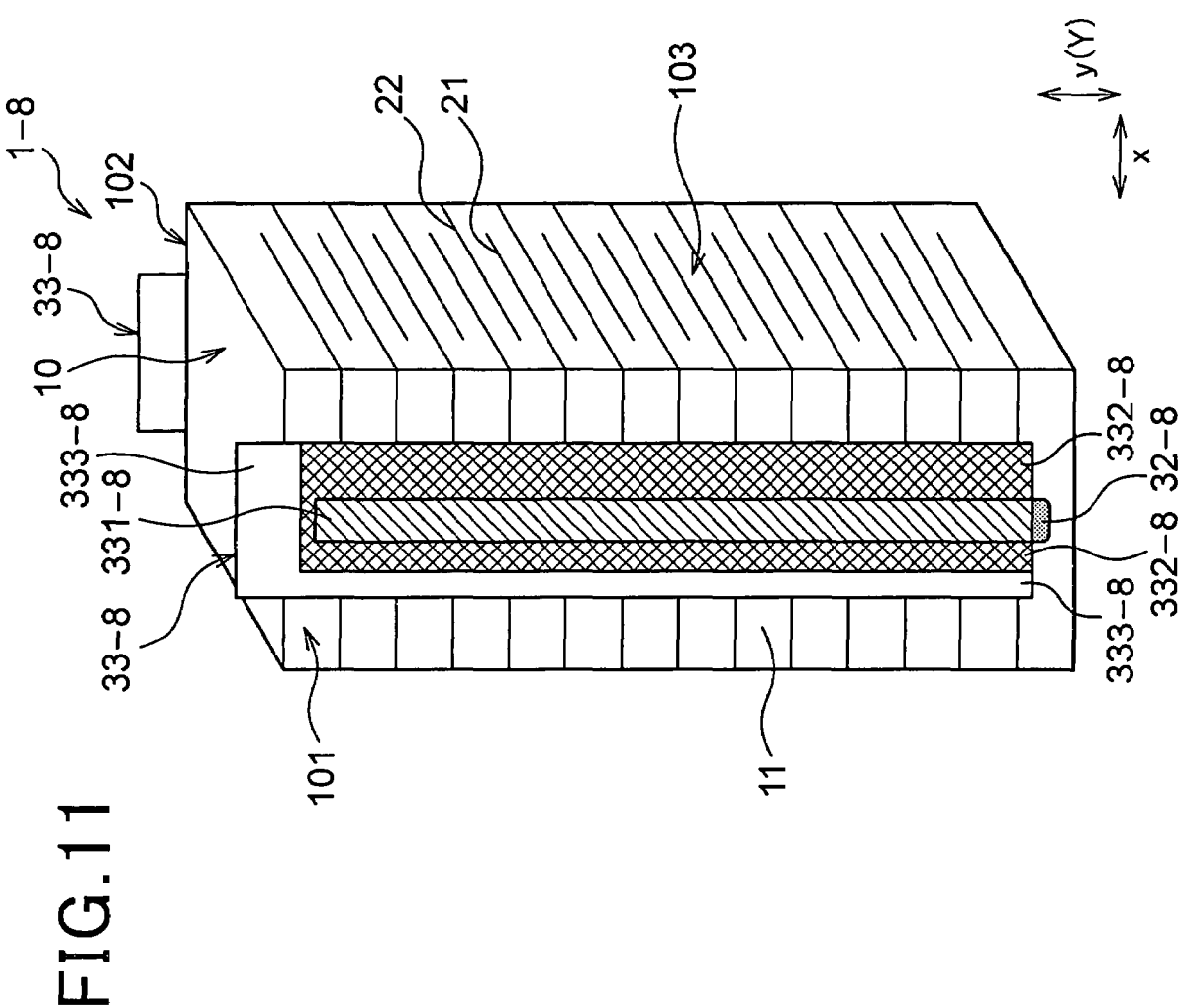

FIG. 11 is a schematic view showing another configuration of the multilayer piezoelectric element according to the third embodiment of the present invention. In the configuration of the multilayer piezoelectric element 1-8 shown in FIG. 11, the fixed part 331-8 is formed at the middle part of the outer electrode 33-8 in the width direction "x", and the rigid part 333-8 has a character "L" shape, where the rigid part 333-8 is formed at one end part of the outer electrode 33-8 in the width direction "x" and also at one end part thereon in the longitudinal direction "y". This configuration can provide easy electrical connection of both the outer electrodes 33-8 to external devices (not shown).

Figure 12:
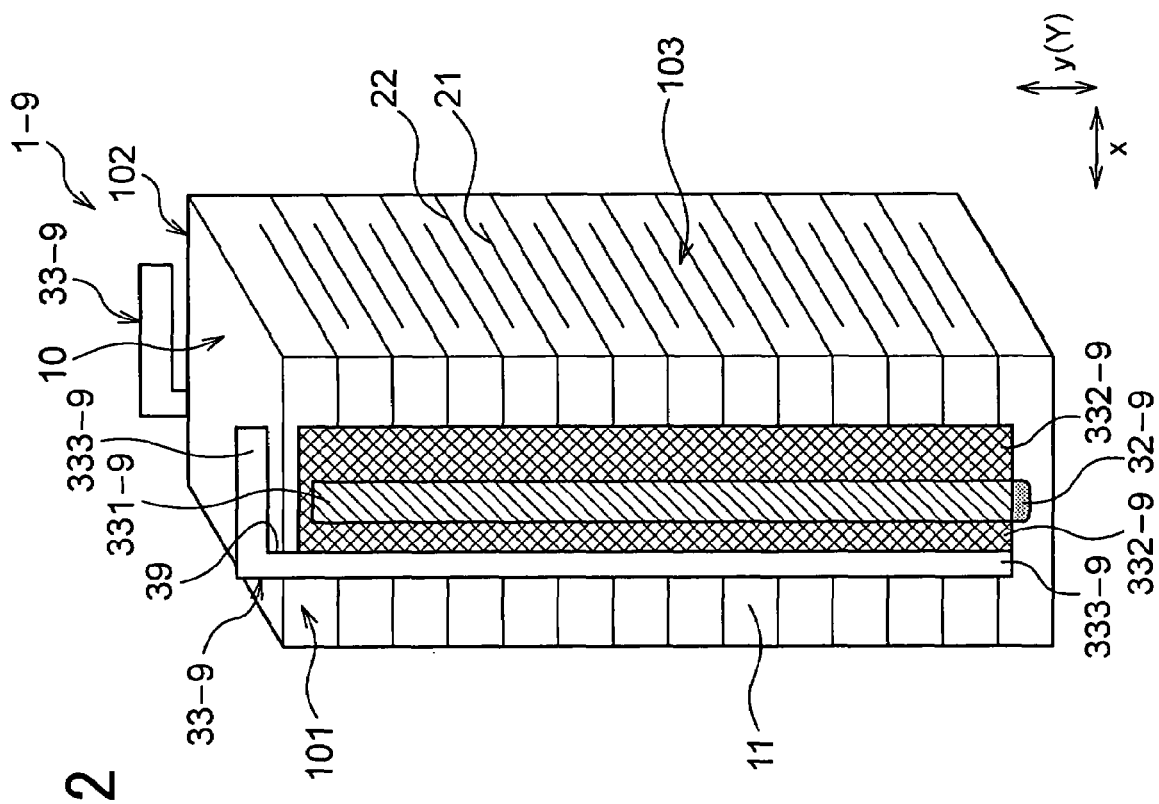

FIG. 12 is a schematic view showing another configuration of the multilayer piezoelectric element according to the third embodiment of the present invention. In the configuration of the multilayer piezoelectric element 1-9 shown in FIG. 12, the fixed part 331-9 is formed at the middle part of the outer electrode 33-9 in the width direction "x", and the rigid part 333-9 has a character "L" shape, where the rigid part 333-9 is formed at one end part of the outer electrode 33-9 in the width direction "x" and also at one end part thereon in the longitudinal direction "y". In particular, a notch part 39 is formed between the rigid part 333-9 and the free part 332-9. Similar to the configuration shown in FIG. 11, the configuration shown in FIG. 12 can provide easy electrical connection of both the outer electrodes 33-9 to external devices (not shown). The formation of the notch part 39 further relaxes the stress generated by the piezoelectric displacement of the multilayer piezoelectric element 1-9.

In the configurations of each outer electrode in the multilayer piezoelectric elements shown in FIG. 4 to FIG. 12, the parts other than the fixed part and the rigid part become the free part. The outer electrode has at least one part in which the fixed part, the free part, and the rigid part are placed in order. Other configuration of the multilayer piezoelectric elements shown in FIG. 4 to FIG. 12 is basically equal to the configuration of the multilayer piezoelectric element of the first embodiment shown in FIG. 1 and FIG. 2.

Fourth Embodiment

A description will be given of a piezoelectric actuator of an injector 6 according to the fourth embodiment as a practical application of the multilayer piezoelectric element 1 of the first and second embodiments with reference to FIG. 13.

Figure 13:
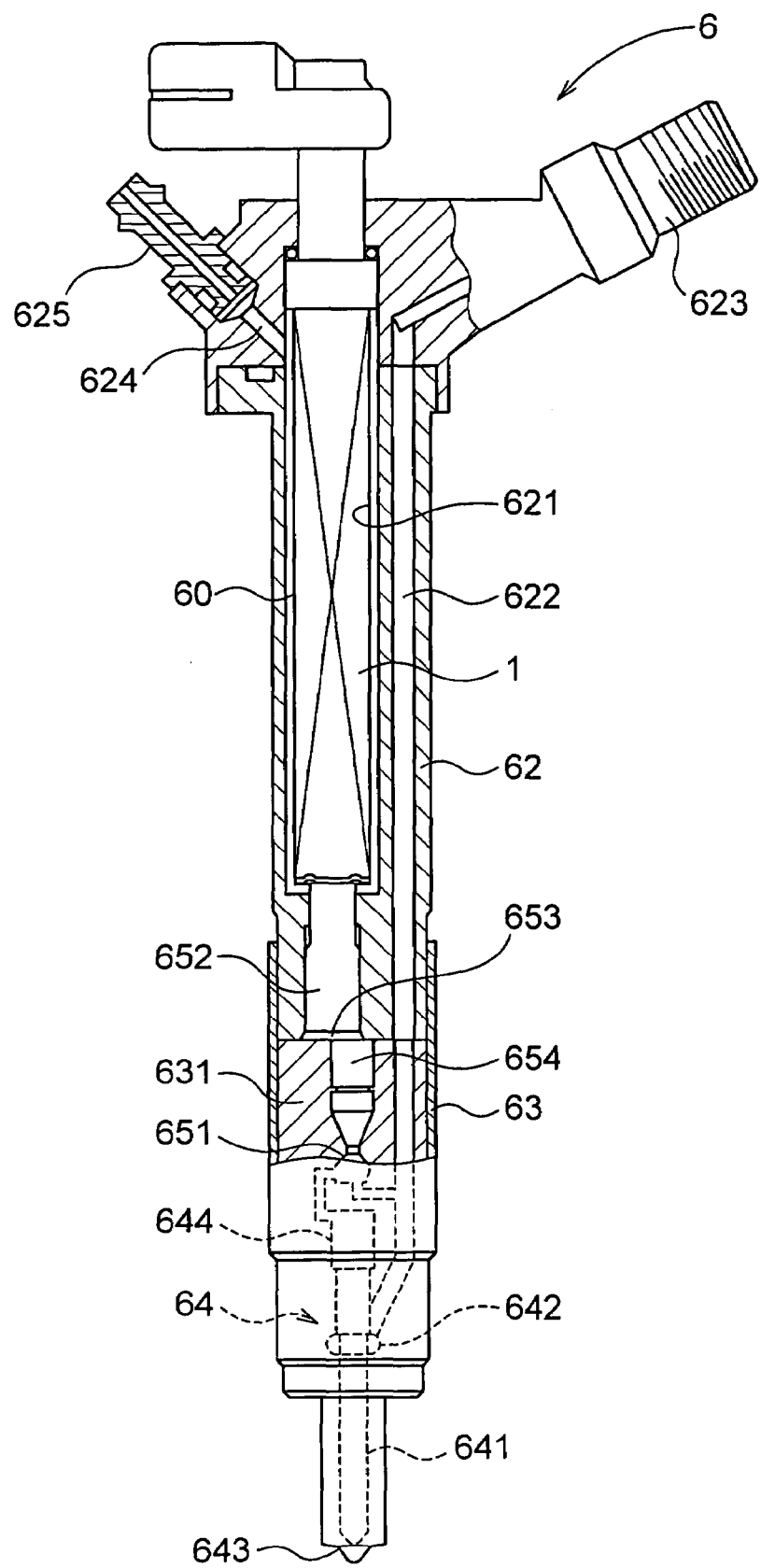
FIG. 13 is a schematic view showing a configuration of an injector to which the multilayer piezoelectric element shown in FIG. 1

As shown in FIG. 13, the injector 6 of the fourth embodiment is applied to a common rail injection system for a diesel engine.

The injector 6 is mainly composed of an upper housing 62 and a lower housing 63. The upper housing 62 accommodates the multilayer piezoelectric element 1 as a driving part. The lower housing 63 fixed to the bottom part of the upper housing 62 accommodates an injection nozzle 64.

The upper housing 62 has an approximate cylinder shape and the multilayer piezoelectric element 1 is entered in and fixed to a longitudinal hole 621 which is not co-axial to the center axis of the upper housing 62.

A high pressure fuel path 662 is formed at the side part of the longitudinal hole 621, and the upper part of the high pressure fuel path 662 is jointed to a common rail (not shown) through a fuel inlet pipe 623 which projects from the upper housing 62.

Further, a fuel introduction pipe 625 which joints to a drain path 624 projects from the upper part of the upper housing 62. The fuel flowing through the fuel introduction pipe 625 is returned to a fuel tank (not shown). The drain path 624 joins to a three-way valve 651 (which will be explained later) through a path (not shown) extended downward in the upper housing 62 and the lower housing 63 from a space 60 formed between the longitudinal hole 621 and the driving part 1 (as the multilayer piezoelectric element).

The injection nozzle 64 is equipped with a nozzle needle 641 and an injection nozzle 643. The nozzle needle 641 is sliding in the longitudinal direction (or in the vertical direction) in the piston body 631. The opening and closing operation of the injection nozzle 643 is controlled by the nozzle needle 641 in order to inject a high-pressure fuel supplied from a fuel pool 642 to each cylinder of the engine. The fuel pool 642 is placed at the middle part around the nozzle needle 641 where the fuel pool 642 and the bottom part of the high-pressure fuel path 622 join to each other. The nozzle needle 614 receives the fuel pressure toward a valve opening-direction from the fuel pool 642 and also receives a fuel pressure applied in the valve-opening direction from a back pressure room 644 formed faced to the upper surface of the nozzle needle 641. Decreasing the pressure supplied from the back pressure room 644 lifts the nozzle needle 641, and the injection hole 643 is thereby open and the fuel is thereby injected to each cylinder of the engine through the injection hole 643.

The three-way valve 651 controls the pressure of the back pressure room 644. The three-way valve 651 has a configuration capable of selectively joining the back pressure room 644 and the high pressure fuel path 622 or the drain path 624. The three-way valve 651 has a ball-shaped valve capable of opening the port which joints the back pressure room 644 and the high pressure fuel path 622 or the drain path 624. The ball-shaped valve is driven through a piston 652 of a large diameter, an oil pressure room 653, and a piston 654 of a small diameter.

In the fourth embodiment, the multilayer piezoelectric element 1 having the configuration of the first and second embodiments is used as the driving power source for the injector 6. As described above, the multilayer piezoelectric element 1 has a superior duration and reliability. Therefore, the use of the multilayer piezoelectric element 1 can enhance the performance of the injector 6.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. A multilayer piezoelectric element comprising:
    a multilayer ceramic body having a stacked structure in which piezoelectric layers made of piezoelectric material and a plurality of inner electrode layers of an electrical conductivity are alternately stacked; and
    a pair of outer electrodes placed on a pair of electrode connecting surfaces in outer circumference surfaces of the multilayer ceramic body so that the outer electrodes are electrically connected alternately to a plurality of the inner electrode layers,
    wherein each outer electrode comprises:
    a fixed part electrically contacted with the corresponding electrode connecting surface through connecting material of electrical conductivity having a smaller width than a width of the outer electrode;
    a free part having a plurality of openings, which does not contact with the connecting material and is expandable in a stacked direction of the multilayer ceramic body; and
    a rigid part of not contacting with the connecting material, and whose sectional area is larger in the width direction of the outer electrode than that of each of the fixed part and the free part,
    wherein each outer electrode has at least a part where the fixed part, the free part and the rigid part are arranged in order.

2. The multilayer piezoelectric element according to claim 1, wherein a plurality of the openings in the free part is formed in a net structure.

3. The multilayer piezoelectric element according to claim 1, wherein the fixed part has a plurality of openings.

4. The multilayer piezoelectric element according to claim 3, wherein a plurality of the openings in the fixed part is formed in a net structure.

5. The multilayer piezoelectric element according to claim 1, wherein the openings are formed by one of expanding process, punching process, etching process, and a laser beam process.

6. The multilayer piezoelectric element according to claim 1, wherein the rigid part has a plate shape without opening.

7. The multilayer piezoelectric element according to claim 1, wherein the rigid part is formed at the end of each outer electrode in the width direction thereof.

8. The multilayer piezoelectric element according to claim 1, wherein an entire width Wa of each outer electrode is less than 10.0 mm.

9. The multilayer piezoelectric element according to claim 1, wherein a width Wr of the rigid part is more than 0.3 mm.

10. The multilayer piezoelectric element according to claim 1, wherein a width Wf of the free part and a longitudinal length Lp of the multilayer ceramic body satisfy the relationship Wf>0.01 Lp.

11. The multilayer piezoelectric element according to claim 1, wherein a sectional area Sr of the rigid part, a maximum driving current Im of the multilayer piezoelectric element, and an allowable current Ia of each outer electrode per unit area satisfy the relationship of (Im/Sr)<Ia.

12. The multilayer piezoelectric element according to claim 1, wherein each outer electrode is made mainly of one of Cu, Au, and Ag.

13. The multilayer piezoelectric element according to claim 1, wherein each outer electrode is made mainly of stainless steel, and the surface of each outer electrode is plated by one of Cu, Au, and Ag.

14. The multilayer piezoelectric element according to claim 1, wherein the connecting material is a conductive adhesion agent.

15. The multilayer piezoelectric element according to claim 1, wherein the connecting material is solder.

16. A piezoelectric actuator for an injector comprising the multilayer piezoelectric element according to claim 1.

* * * * *